US010050200B2

(12) United States Patent
Xie et al.

(10) Patent No.: US 10,050,200 B2
(45) Date of Patent: *Aug. 14, 2018

(54) ORGANIC THIN FILM TRANSISTOR AND MANUFACTURING METHOD THEREOF, ARRAY SUBSTRATE

(71) Applicant: BOE Technology Group Co., Ltd., Beijing (CN)

(72) Inventors: Yingtao Xie, Beijing (CN); Shihong Ouyang, Beijing (CN); Shucheng Cai, Beijing (CN); Qiang Shi, Beijing (CN); Ze Liu, Beijing (CN); Honhang Fong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/634,748

(22) Filed: Jun. 27, 2017

(65) Prior Publication Data

US 2017/0294584 A1 Oct. 12, 2017

Related U.S. Application Data

(63) Continuation of application No. 14/799,739, filed on Jul. 15, 2015, now Pat. No. 9,728,723.

(30) Foreign Application Priority Data

Dec. 16, 2014 (CN) .......................... 2014 1 0784404

(51) Int. Cl.
*H01L 51/00* (2006.01)
*H01L 51/05* (2006.01)
*H01L 51/10* (2006.01)

(52) U.S. Cl.
CPC ...... *H01L 51/0015* (2013.01); *H01L 51/0541* (2013.01); *H01L 51/0545* (2013.01);
(Continued)

(58) Field of Classification Search
None
See application file for complete search history.

(56) References Cited

U.S. PATENT DOCUMENTS 9,728,723 B2 * 8/2017 Xie ...................... H01L 51/002
2001/0007357 A1 7/2001 Zhang et al.
(Continued)

FOREIGN PATENT DOCUMENTS

CN 85109088 A 8/1986
CN 102636927 A 8/2012
(Continued)

OTHER PUBLICATIONS

Jul. 19, 2016—(CN)—First Office Action Appn 201410784404.4 with English Tran.
(Continued)

*Primary Examiner* — Jack Chen
(74) *Attorney, Agent, or Firm* — Banner & Witcoff, Ltd.

(57) ABSTRACT

An organic thin film transistor, a manufacturing method thereof and an array substrate are provided. The manufacturing method of an organic thin film transistor includes: forming an organic semiconductor layer; partially sheltering the organic semiconductor layer, so that a sheltered region and an unsheltered region are formed on the organic semiconductor layer, the sheltered region corresponding to a region where an active layer of the organic thin film transistor needs to be formed; and doping the organic semiconductor layer, so that the organic semiconductor layer in correspondence with the sheltered region is not doped, and the organic semiconductor layer in correspondence with the unsheltered region is doped.

14 Claims, 8 Drawing Sheets

(52) U.S. Cl.
CPC .......... *H01L 51/105* (2013.01); *H01L 51/107* (2013.01); *H01L 51/0558* (2013.01)

(56) References Cited

U.S. PATENT DOCUMENTS

2003/0096458 A1    5/2003    Park et al.
2013/0049118 A1    2/2013    Katsuhara

FOREIGN PATENT DOCUMENTS

CN    103700705 A    4/2014
KR    100723289 B1    5/2007

OTHER PUBLICATIONS

Sep. 21, 2016—(CN)—Second Office Action Appn 201410784404.4 with English Tran.

\* cited by examiner

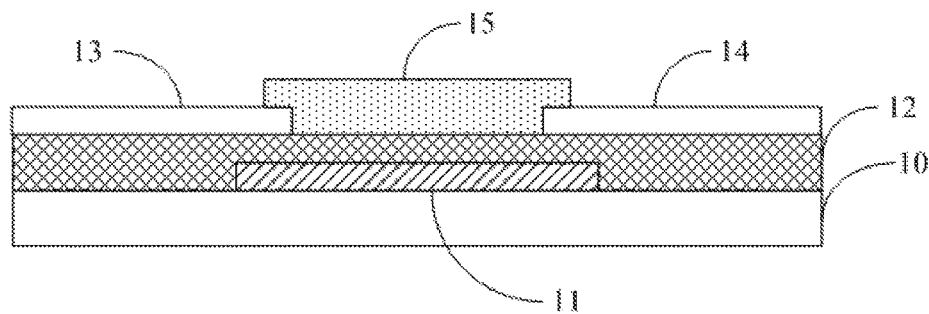

FIG. 1

| partially sheltering the organic semiconductor layer, so that a sheltered region and an unsheltered region are formed on the organic semiconductor layer, wherein, the sheltered region corresponds to a region where an active layer of the organic thin film transistor needs to be formed | ⟵ S201 |

| doping the organic semiconductor layer, so that the organic semiconductor layer corresponding to the sheltered region is not doped, and the organic semiconductor layer corresponding to the unsheltered region is doped | ⟵ S202 |

FIG. 2

ORGANIC THIN FILM TRANSISTOR AND MANUFACTURING METHOD THEREOF, ARRAY SUBSTRATE

This application is a continuation of U.S. patent application Ser. No. 14/799,739 filed Jul. 15, 2015, which claims priority to Chinese Patent Application No. 201410784404.4 filed on Dec. 16, 2014. The present application claims priority to and the benefit of the above-identified application and is incorporated herein in its entirety.

TECHNICAL FIELD

Embodiments of the present invention relate to an organic thin film transistor and a manufacturing method thereof, an array substrate.

BACKGROUND

In recent years, along with the discovery and development of organic semiconductor materials, an organic thin film transistor device, in which an organic material instead of an inorganic material is used for carrier transportation, has been prepared, and performance of the device is being promoted gradually. The fundamental structure and function of an Organic Thin Film Transistor (OTFT) are basically the same as those of a traditional Thin Film Transistor (TFT), and the difference lies in that, an organic semiconductor is used by it as the working substance. Regarding a traditional inorganic thin film transistor, it is a field effect transistor of Metal Oxide Semiconductor (MOS) type, and its semiconductor material is usually inorganic silicon. While an organic semiconductor material is used in an organic thin film transistor to replace an inorganic semiconductor material in MOS. As compared with an existing amorphous silicon or polysilicon TFT, an OTFT has the following features. It has low processing temperature, usually below 180° C., so that the energy consumption is decreased significantly, and it is suitable for flexible substrates. In addition, it also has greatly simplified technological process, substantially reduced cost, wide material sources, and big developing potentialities. It is possible for OTFTs to find applications in many electronic products, such as, active matrix displays, smart cards, labels for commodity price and inventory classification, large-area sensor arrays, etc.

As illustrated in FIG. 1, the construction of an organic thin film transistor in prior art includes a base substrate 10, a gate electrode 11 located on the base substrate 10, a gate insulating layer 12 located on the gate electrode 11, a source electrode 13 and a drain electrode 14 that are located on the gate insulating layer 12, and an organic semiconductor active layer 15 located on the source electrode 13 and the drain electrode 14. A photolithography process is usually used for formation of the organic semiconductor active layer 15 in prior art. In the photolithography process, formation of a channel of the organic semiconductor layer is mainly achieved in such a way that the organic semiconductor layer is patterned by using an etching method. But when the channel of the organic semiconductor layer is formed by using an etching method, a photoresist solvent for the etched layer will have an effect on the channel, such as surface dissolution. In addition, channel edges after etch may be affected by an etching media, and for example, edge overetch, oxidation, injection of ions from sidewall or other effect results. In general, such a processing method will affect performance of the channel, and will lead to increasing of a leakage current of the organic thin film transistor.

In summary, when an organic semiconductor layer is patterned by using an etching method in prior art, a photoresist solvent for the etched layer will make an impact on the organic semiconductor layer, leading to degradation in performance of the organic thin film transistor device, and reduction in its service life.

SUMMARY

According to an embodiment of the present invention, there is provided a manufacturing method of an organic thin film transistor, which includes forming an organic semiconductor layer; partially sheltering the organic semiconductor layer, so that a sheltered region and an unsheltered region are formed on the organic semiconductor layer, wherein, the sheltered region corresponds to a region where an active layer of the organic thin film transistor needs to be formed; and doping the organic semiconductor layer, so that the organic semiconductor layer in correspondence with the sheltered region is not doped, and the organic semiconductor layer in correspondence with the unsheltered region is doped.

According to another embodiment of the present invention, there is provided an organic thin film transistor, which includes an organic semiconductor layer including a doped region and a non-doped region, the non-doped region corresponding to a region where an active layer of the organic thin film transistor needs to be formed.

According to still another embodiment of the present invention, there is provided an array substrate, which includes the above-mentioned organic thin film transistor.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a schematically sectional view illustrating a structure of an organic thin film transistor in prior art;

FIG. 2 is a flowchart illustrating a manufacturing method of an organic thin film transistor provided by an embodiment of the invention;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to embodiments of the invention, there are provided an organic thin film transistor and manufacturing method thereof, an array substrate and a display device, for achieving such a goal that use of an etching method is not required when an organic semiconductor layer of the organic thin film transistor is patterned, and in turn, performance of the organic thin film transistor is enhanced.

The manufacturing method of an organic thin film transistor provided by embodiments of the present invention will be introduced below in detail in conjunction with attached drawings.

As illustrated in FIG. 2, according to an embodiment of the invention, there is provided a manufacturing method of an organic thin film transistor, which includes forming an organic semiconductor layer. After forming the organic semiconductor layer, the method further includes the following steps S201 and S202.

S201, the organic semiconductor layer is partially sheltered, so that a sheltered region and an unsheltered region are formed on the organic semiconductor layer, wherein, the sheltered region corresponds to a region where an active layer of the organic thin film transistor needs to be formed;

S202, the organic semiconductor layer is doped, so that the organic semiconductor layer in correspondence with the sheltered region is not doped, and the organic semiconductor layer in correspondence with the unsheltered region is doped.

For example, the region of the active layer of the organic thin film transistor in embodiments of the invention includes a channel zone located between a source electrode and a drain electrode of the organic thin film transistor, a zone where the source electrode contacts with the organic semiconductor layer, and a zone where the drain electrode contacts with the organic semiconductor layer.

The organic thin film transistor manufactured by embodiments of the invention may be a bottom-gate organic thin film transistor, and may also be a top-gate organic thin film transistor.

First Embodiment

Figure 3:
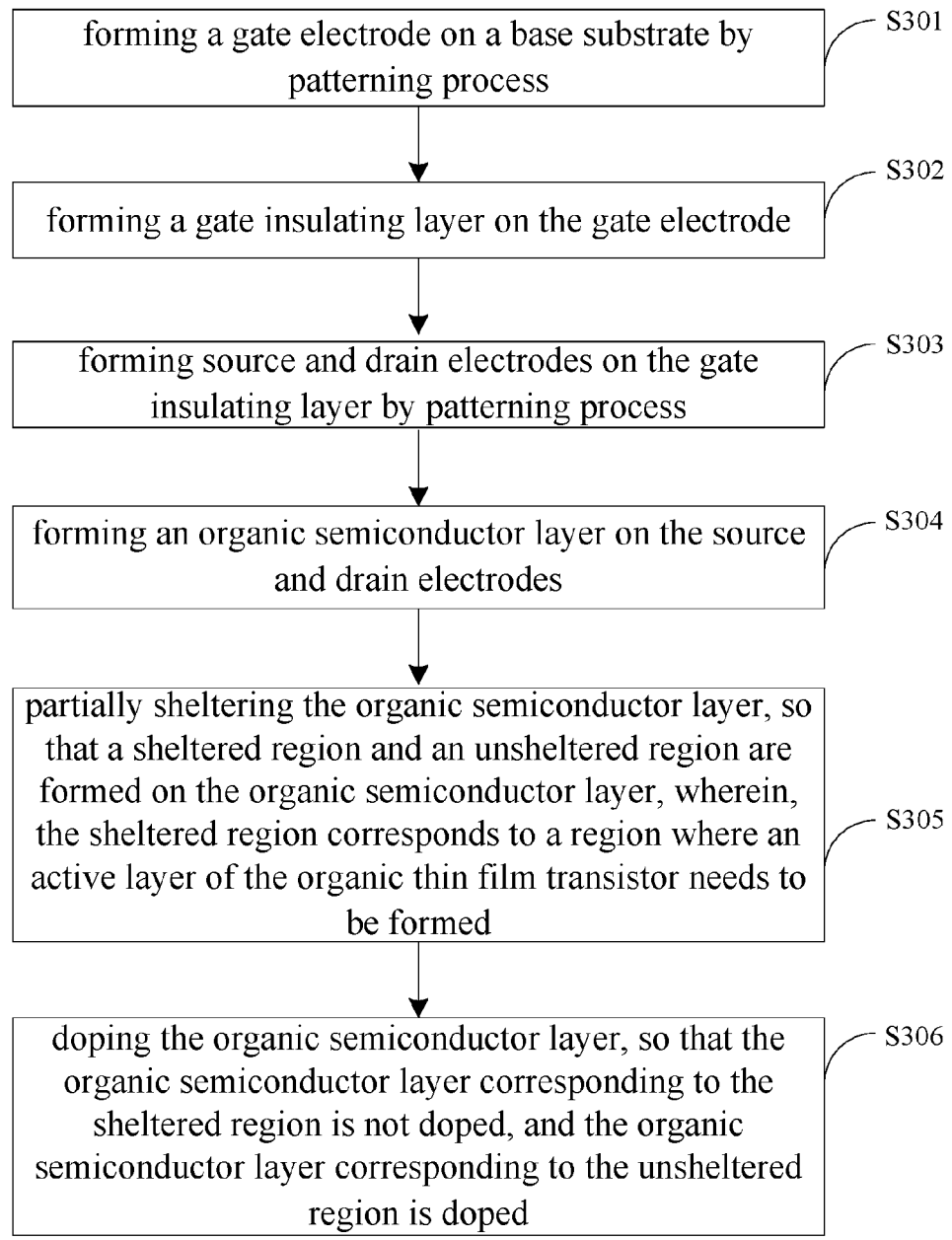
FIG. 3 is a flowchart illustrating a manufacturing method of a bottom-gate organic thin film transistor provided by an embodiment of the invention.

As illustrated in FIG. 3, the manufacturing method of an organic thin film transistor provided by an embodiment of the invention includes the following steps S301-S306.

S301, a gate electrode is formed on a base substrate by a patterning process;

S302, a gate insulating layer is formed on the gate electrode;

S303, a source electrode and a drain electrode are formed on the gate insulating layer by a patterning process;

S304, an organic semiconductor layer is formed on the source electrode and the drain electrode;

S305, the organic semiconductor layer is partially sheltered, so as to form a sheltered region and an unsheltered region on the organic semiconductor layer, wherein, the sheltered region corresponds to a region where an active layer of the organic thin film transistor needs to be formed;

S306, the organic semiconductor layer is doped, so that the organic semiconductor layer in correspondence with the sheltered region is not doped, and the organic semiconductor layer in correspondence with the unsheltered region is doped.

Figure 4:
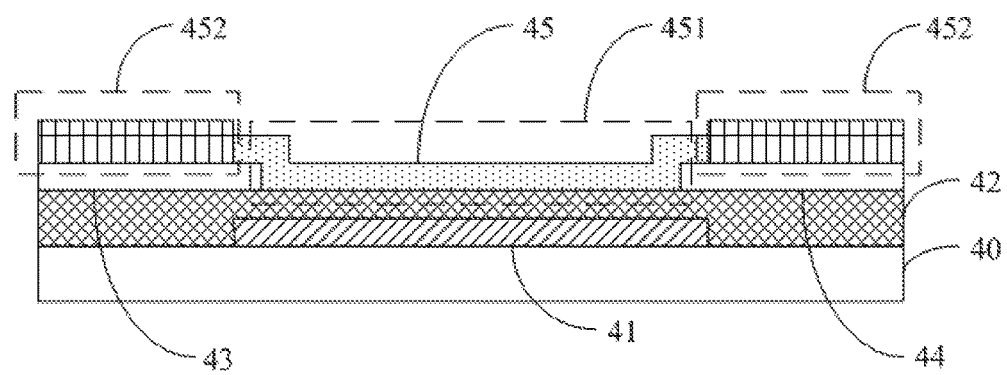
FIG. 4 is a schematic view illustrating a sectional structure of a bottom-gate organic thin film transistor provided by an embodiment of the invention.

For example, the organic thin film transistor manufactured by the above method according to embodiments of the invention is illustrated in FIG. 4. Firstly, a gate electrode 41 is formed on a base substrate 40 by a patterning process, and the base substrate 40 in embodiments of the invention may be a glass substrate, and may also be a plastic substrate or a substrate coated with an insulating layer. The patterning process in embodiments of the invention refers to a photolithographic process including photoresist coating, exposure and development, an etching process and a photoresist removing process after the etch. The exemplified process of producing the gate electrode 41 by a patterning process in embodiments of the invention is that, a layer of a gate thin film is deposited on a base substrate 40 by thermal evaporation or sputtering, and for example, metal, indium tin oxide (ITO), doped silicon, an organic conductor or the like may be chosen for the gate thin film. For example, a metallic material, such as metal aluminum (Al), may be chosen for the gate thin film in embodiments of the invention. The thickness of the deposited gate thin film in embodiments of the invention may be in the range of 20 micrometers (nm) to 200 nm. Embodiments of the invention do not set a limit to thickness of the gate thin film, and in the actual production process, it can be adjusted according to specific technological requirements. A layer of photoresist is coated on the deposited gate thin film, and for example, the coated photoresist in embodiments of the invention may be a positive photoresist, next, light exposure at 365 nm is conducted on the positive photoresist with a mask, then development is performed by using Tetra Methyl Ammonium Hydroxide (TMAH) with a concentration of 2.38%, the exposed gate thin film is etched off by wet etching, and finally, the remaining photoresist is removed, thereby forming the gate electrode 41 in the embodiment of the invention.

Next, a gate insulating layer 42 is formed on the gate electrode 41, and the gate insulating layer 42 in embodiments of the invention is an insulating thin film including silicon oxide (SiOx), silicon nitride (SiNx), a metal oxide, a metal nitride, an organic material or the like. For example, SiOx is chosen for the gate insulating layer in the embodiment of the invention, and specifically, according to an embodiment of the invention, by way of Plasma Enhanced Chemical Vapor Deposition (PECVD), the SiOx is generated by reaction of hydrogenated silicon ($SiH_4$) gas with nitrogen oxide ($N_2O$) gas. Thickness of the deposited gate insulating layer in embodiments of the invention is in the range of 30 nm to 1000 nm. Embodiments of the invention do not set a limit to thickness of the gate insulating layer, and in the actual production process, it can be adjusted according to specific technological requirements.

After that, a source electrode 43 and a drain electrode 44 are formed on the gate insulating layer 42 by a patterning process, and for example, a layer of a source/drain thin film is deposited on the base substrate with the gate insulating layer 42 deposited thereon by thermal evaporation or sputtering. Metal, ITO or the like may be chosen for the source/drain thin film. For example, the source/drain thin film in the embodiment of the invention selects a metallic material, such as, metal gold (Au), silver (Ag), molybdenum (Mo), aluminum (Al), copper (Cu) or the like. Thickness of the deposited source/drain thin film in embodiments of the invention is in the range of 20 nm to 300 nm. Embodiments of the invention do not set a limit to thickness of the source/drain thin film, and in the actual production process, it can be adjusted according to specific technological requirements. A layer of photoresist is coated on the deposited source/drain thin film, and for example, the coated photoresist in the embodiment of the invention is a positive photoresist, next, light exposure at 365 nm is conducted on the positive photoresist with a mask, then development is performed by using TMAH with a concentration of 2.38%, the exposed source/drain thin film is etched off by way of wet etching, and finally, the remaining photoresist is removed, thereby forming the source electrode 43 and the drain electrode 44 in the embodiment of the invention.

Next, an organic semiconductor layer 45 is formed on the source electrode 43 and the drain electrode 44, and the organic semiconductor layer in the embodiment of the invention is of a small molecular or high molecular polymer. For example, an organic semiconductor layer 45 is formed on the source electrode 43 and the drain electrode 44 by a solution method or vacuum evaporation method according to embodiments of the invention, and thickness of the formed organic semiconductor layer in embodiments of the invention is in the range of 10 nm to 200 nm. Embodiments of the invention do not set a limit to thickness of the organic semiconductor layer, and in the actual production process, it can be adjusted according to specific technological requirements.

Figure 5:
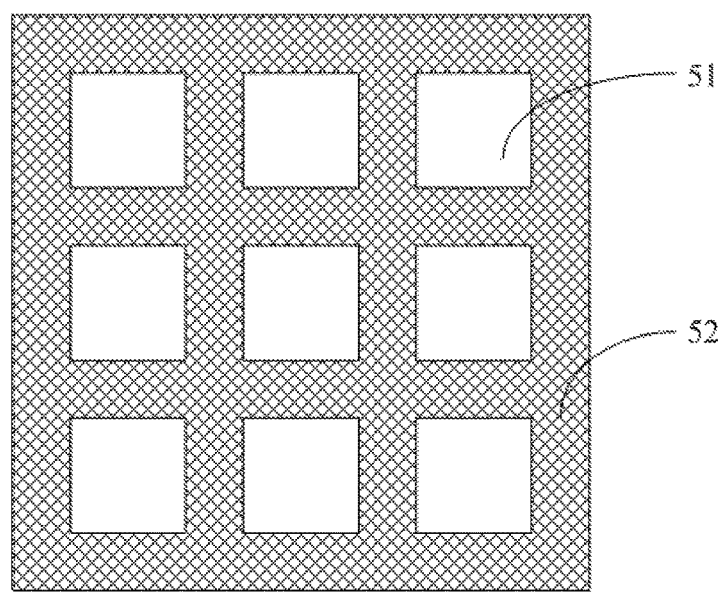
FIG. 5 is a schematic view illustrating a planar structure after patterning of an organic semiconductor layer in an organic thin film transistor provided by an embodiment of the invention.

After that, the organic semiconductor layer 45 is partially sheltered, so that a sheltered region 451 and an unsheltered region 452 are formed on the organic semiconductor layer. The sheltered region 451 corresponds to a region where an active layer of the organic thin film transistor needs to be formed. After it is sheltered, the organic semiconductor layer 45 is doped, so that the organic semiconductor layer in correspondence with the sheltered region 451 is not doped, and the organic semiconductor layer in correspondence with the unsheltered region 452 is doped. For example, doping of the organic semiconductor layer 45 according to embodiments of the invention includes that, the organic semiconductor layer 45 is doped by a solution method or a vacuum evaporation method, and the dopant used when the organic semiconductor layer 45 is doped in embodiments of the invention is an organic small molecule. For example, the organic small molecule in embodiments of the invention is PAG (photoacid generator) or PBG (photobase generator). As regards a zone of the organic semiconductor layer 45 that is doped, its conductivity or mobility is decreased, and by this method, an organic thin film pattern or array may be formed, without the necessity of etching the organic semiconductor layer 45. The result diagram after doping of the organic semiconductor layer 45 is illustrated in FIG. 5, and by this method, a plurality of organic thin film patterns 51 having a semiconductor function is formed, and at the same time, an insulating region 52 that loses a semiconductor function is also formed. The region where the organic thin film patterns 51 are located corresponds to a non-doped region of the organic semiconductor layer, and the insulating region 52 corresponds to a doped region of the organic semiconductor layer.

Figure 6:
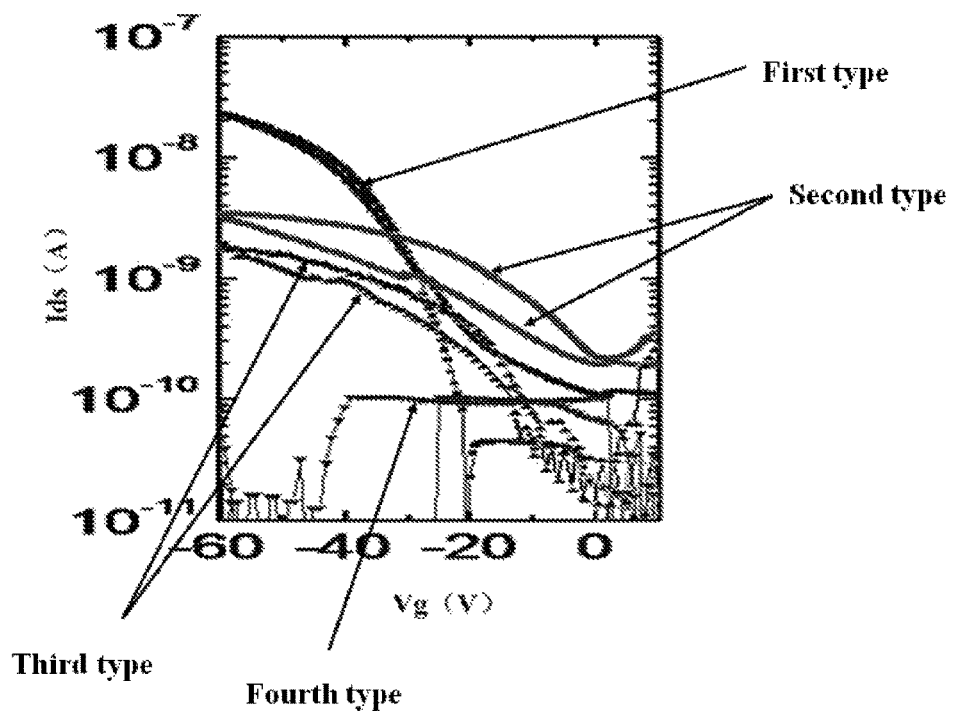
FIG. 6 is a schematic diagram illustrating a electrical test before and after doping of an organic semiconductor layer in an organic thin film transistor provided by an embodiment of the invention.

In order to verity electrical effects of the organic semiconductor layer after doping in embodiments of the invention, the inventor has carried out some experimental verification, and the verification results are illustrated in FIG. 6. Organic thin film transistors of four different types are prepared in the experiment, respectively. An organic semiconductor layer in an organic thin film transistor of the first type is not doped; an organic semiconductor layer in an organic thin film transistor of the second type is doped, and the doped organic semiconductor layer is irradiated with ultraviolet light for one minute; an organic semiconductor layer in an organic thin film transistor of the third type is also doped, and the doped organic semiconductor layer is irradiated with ultraviolet light for one minute firstly, and then is subjected to after-baking for 15 minutes at 80° C.; an organic semiconductor layer in an organic thin film transistor of the fourth type is also doped, and the doped organic semiconductor layer is irradiated with ultraviolet light for one minute, and then is subjected to after-baking for 1 hour at 180° C. As can be seen from the drawing, the organic thin film transistor of the first type exhibits normal transistor characteristics, the current of the organic thin film transistor of the second type is reduced by one order of magnitude relative to the current of the organic thin film transistor of the first type, the current of the organic thin film transistor of the third type is further reduced, and the current of the organic thin film transistor of the fourth type is reduced to $10^{-10}$ to $10^{-11}$ A. It is further verified by this experiment that, a doped organic semiconductor layer is reduced in conductivity or mobility, and exhibits an insulating feature.

In some examples, there are two methods of partially sheltering an organic semiconductor layer and doping the organic semiconductor layer in embodiments of the invention, and they will be introduced below in detail in conjunction with attached drawings.

Figure 7:
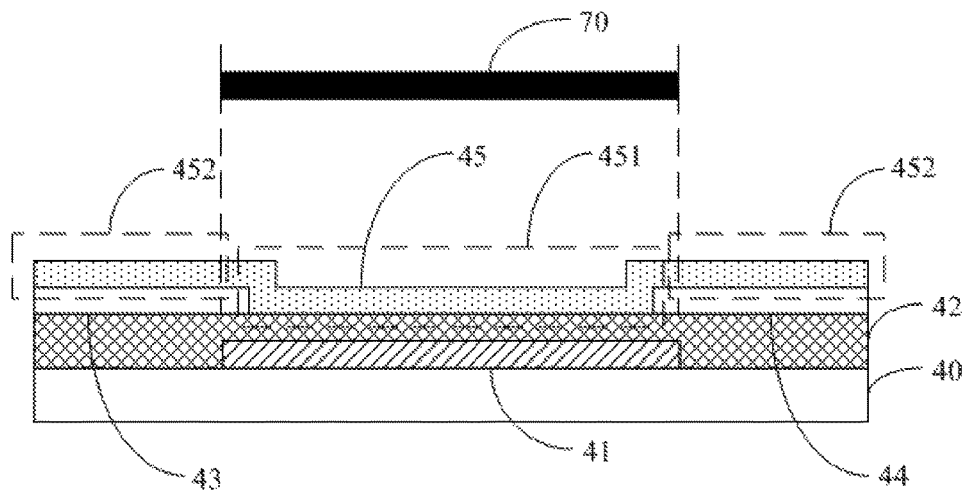
FIG. 7 to FIG. 8 are schematic views illustrating sectional structures in the course of patterning an organic semiconductor layer of an organic thin film transistor with a metal mask provided by an embodiment of the invention.

Method 1: as illustrated in FIG. 7, an organic semiconductor layer 45 is partially sheltered by a metal mask 70, and a sheltered region 451 and an unsheltered region 452 are formed on the organic semiconductor layer, wherein, the region 451 that is sheltered by the metal mask 70 corresponds to a region where an active layer of an organic thin film transistor needs to be formed.

Figure 8:
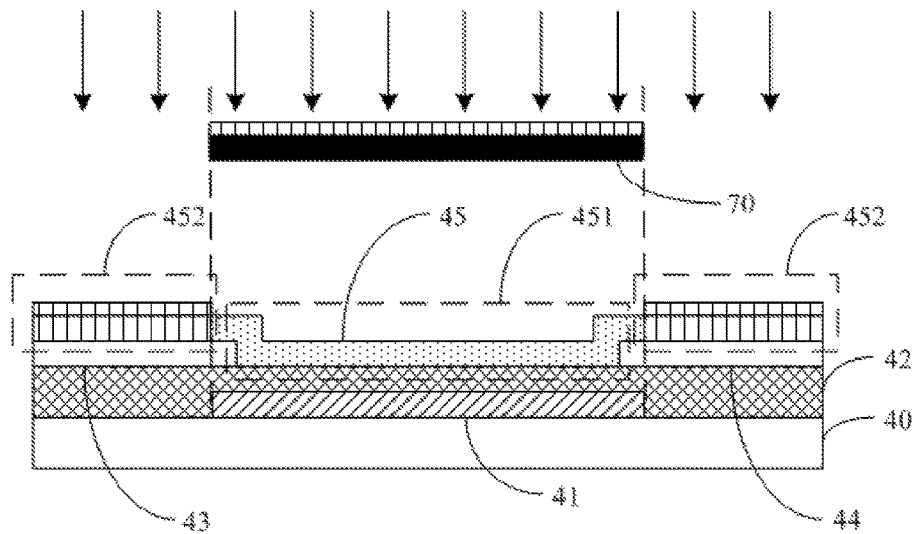

As illustrated in FIG. 8, the organic semiconductor layer 45 is doped, as indicated by an arrow direction in the figure. Because there is the metal mask 70 lying over the sheltered region 451 of the organic semiconductor layer, dopants are blocked by the metal mask 70 and cannot reach the sheltered region 451 of the organic semiconductor layer 45, and the organic semiconductor layer 45 in correspondence with the sheltered region 451 is not doped; while there is no metal mask 70 over the unsheltered region 452 of the organic semiconductor layer 45, the organic semiconductor layer 45 in correspondence with the unsheltered region 452 is doped at this time. After doping, the metal mask 70 is removed, and an organic thin film transistor in embodiments of the invention can be formed.

Figure 9:
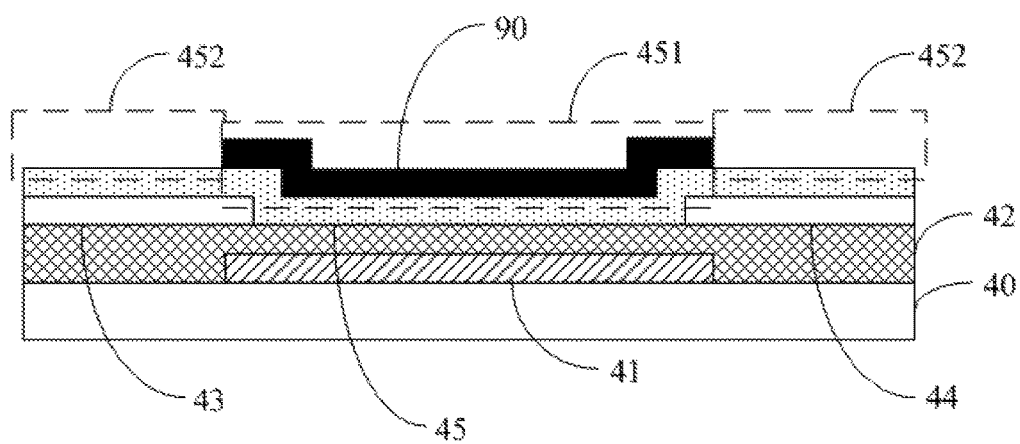
FIG. 9 to FIG. 10 are schematic views illustrating sectional structures in the course of patterning an organic semiconductor layer of an organic thin film transistor with a photoresist mask provided by an embodiment of the invention.

Method 2: as illustrated in FIG. 9, a layer of photoresist 90 is coated on an organic semiconductor layer 45. For example, the photoresist in embodiments of the invention is a fluorinated photoresist, and is partially removed by exposure and development, and a photoresist covering region (i.e. a sheltered region 451 of the organic semiconductor layer 45) and a photoresist uncovering region (i.e. an unsheltered region 452 of the organic semiconductor layer 45) are formed on the organic semiconductor layer 45. The photoresist covering region corresponds to a region where an active layer of an organic thin film transistor needs to be formed.

Figure 10:
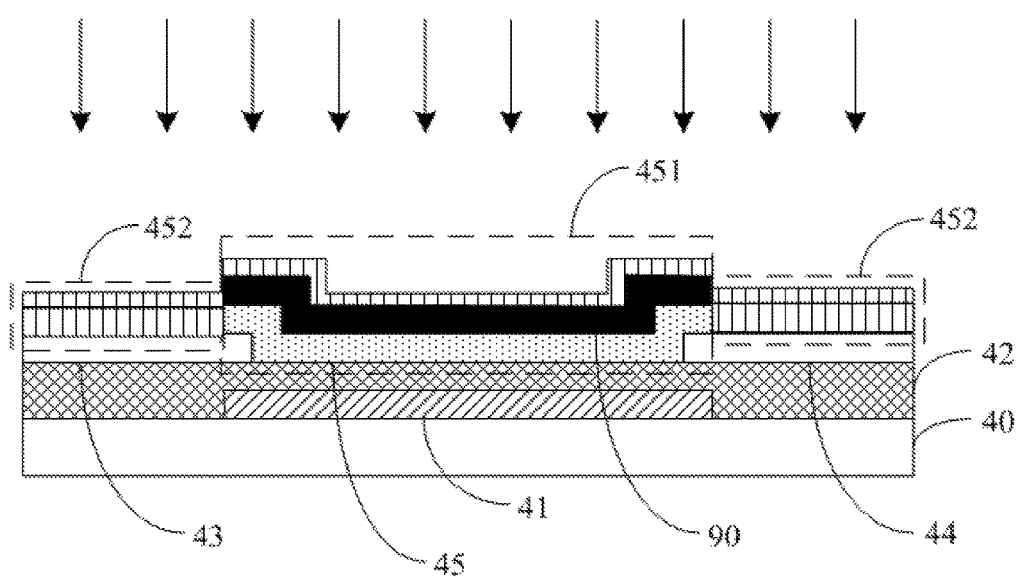

As illustrated in FIG. 10, the organic semiconductor layer 45 is doped, as indicated by an arrow direction in the figure. For example, the dopant in embodiments of the invention is PAG. As regards the photoresist covering region, because the photoresist 90 lies over the organic semiconductor layer 45, the organic semiconductor layer 45 in correspondence with this region is not doped; as regards the photoresist uncovering region, the organic semiconductor layer 45 in correspondence with this region is doped. In embodiments of the invention, for the sake of arousing the doping efficiency, after PAG doping is conducted on the organic semiconductor layer 45, the organic semiconductor layer 45 is subjected to light exposure at 365 nm for one minute, next, after-baking at 180° C. for one hour under nitrogen atmosphere, and then rinsing with Propylene Glycol Monomethyl Ether Acetate (PGMEA), so as to wash the PAG leftover on a surface of the organic semiconductor layer 45. Finally, the photoresist covering the organic semiconductor layer 45 is removed, thereby forming an organic thin film transistor in embodiments of the invention.

The organic thin film transistor manufactured by using the first embodiment of the invention is a bottom-gate organic thin film transistor. In addition, a source electrode and a drain electrode of the organic thin film transistor formed by embodiments of the invention may also be located above an organic semiconductor layer, and the manufacturing process is similar to the method in the first embodiment, details being omitted here.

Second Embodiment

Figure 11:
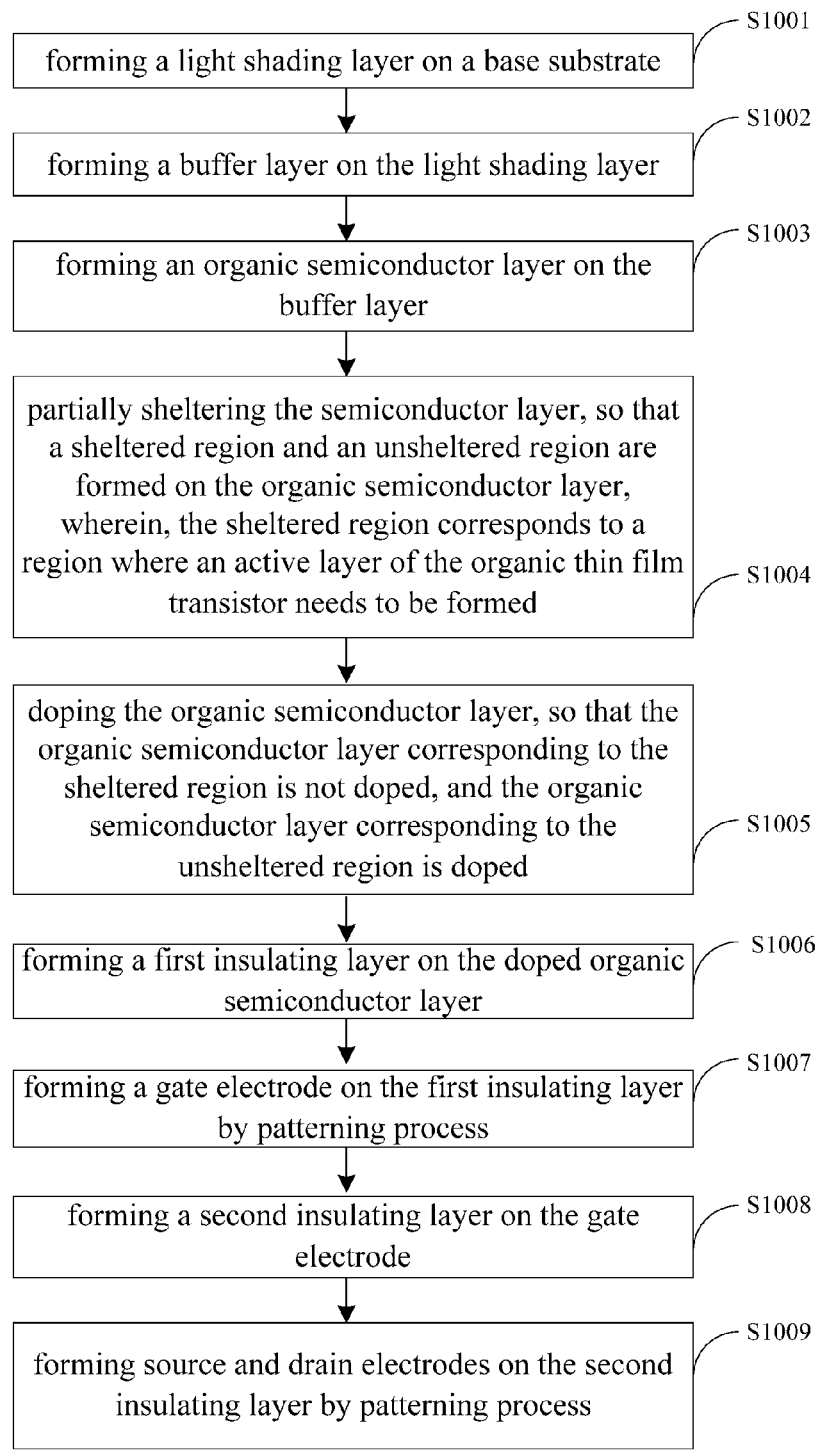
FIG. 11 is a flowchart illustrating the manufacturing method of a top-gate organic thin film transistor provided by an embodiment of the invention.

As illustrated in FIG. 11, the manufacturing method of an organic thin film transistor provided by embodiments of the invention includes the following steps of S1001-S1009.

S1001, a light blocking layer is formed on a base substrate.

S1002, a buffer layer is formed on the light blocking layer.

S1003, an organic semiconductor layer is formed on the buffer layer.

S1004, the organic semiconductor layer is partially sheltered, and a sheltered region and an unsheltered region are formed on the organic semiconductor layer, wherein, the sheltered region corresponds to a region where an active layer of an organic thin film transistor needs to be formed.

S1005, the organic semiconductor layer is doped, so that the organic semiconductor layer in correspondence with the sheltered region is not doped, and the organic semiconductor layer in correspondence with the unsheltered region is doped.

S1006, a first insulating layer is formed on the doped organic semiconductor layer.

S1007, a gate electrode is formed on the first insulating layer by a patterning process.

S1008, a second insulating layer is formed on the gate electrode.

S1009, a source electrode and a drain electrode are formed on the second insulating layer by a patterning process.

Figure 12:
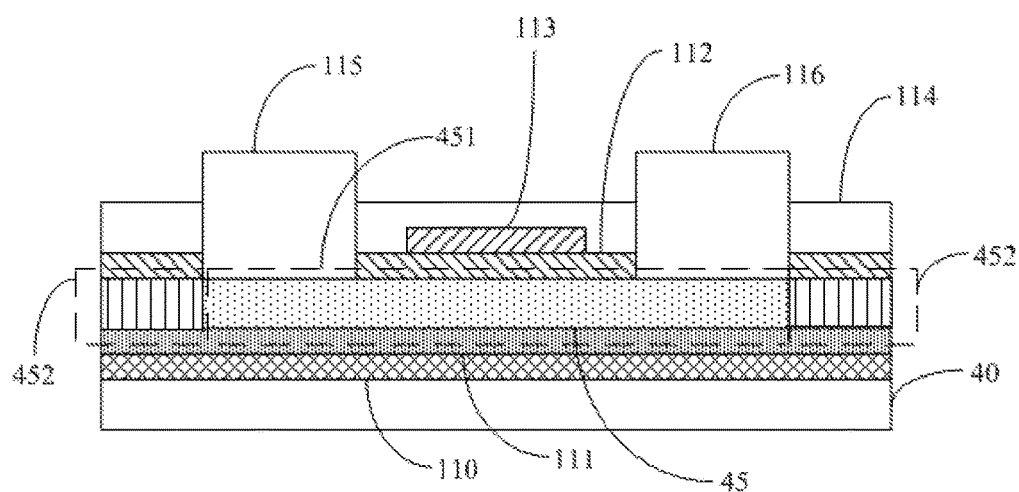
FIG. 12 is a schematic view illustrating the sectional structure of a top-gate organic thin film transistor provided by an embodiment of the invention.

The organic thin film transistor manufactured by the above method according to embodiments of the invention is illustrated in FIG. 12. The method includes that, a light blocking layer 110 is formed on a base substrate 40, and the exemplified manufacturing process of the light blocking layer is the same as that in prior art, details being omitted here. A buffer layer 11 is formed on the light blocking layer 110, and the exemplified manufacturing process of the buffer layer 111 is the same as that in prior art, details being omitted here. An organic semiconductor layer 45 is formed on the buffer layer 111, and the exemplified manufacturing process of the organic semiconductor layer is the same as that in first embodiment, details being omitted here. The organic semiconductor layer 45 is partially sheltered, and a sheltered region 451 and an unsheltered region 452 are formed on the organic semiconductor layer 45, wherein, the sheltered region 451 corresponds to a region where an active layer of the organic thin film transistor needs to be formed. The organic semiconductor layer 45 is doped, so that the organic semiconductor layer 45 in correspondence with the sheltered region 451 is not doped, and the organic semiconductor layer in correspondence with the unsheltered region 452 is doped. The organic semiconductor layer is partially sheltered in the second embodiment of the invention, and the method of doping the organic semiconductor layer is the same as that in the first embodiment, details being omitted here. A first insulating layer 112 is formed on the doped organic semiconductor layer 45, and the exemplified manufacturing process of the first insulating layer is the same as that in prior art, details being omitted here. A gate electrode 113 is formed on the first insulating layer 112 by a patterning process, and the exemplified manufacturing process of the gate electrode is the same as that in prior art, details being omitted here. A second insulating layer 114 is formed on the gate electrode 113, and the exemplified manufacturing process of the second insulating layer is the same as that in prior art, details being omitted here. A source electrode 115 and a drain electrode 116 are formed on the second insulating layer 114 by a patterning process, and the source electrode 115 and the drain electrode 116 contact with the organic semiconductor layer 45 through via holes, respectively. The exemplified manufacturing processes of the source electrode 115 and the drain electrode 116 as well as the via holes are the same as those in prior art, and details are omitted here.

The organic thin film transistor manufactured according to the second embodiment of the invention is a top-gate organic thin film transistor. In addition, a source electrode and a drain electrode of the organic thin film transistor manufactured by embodiments of the invention may also be located below an organic semiconductor layer, and the manufacturing process is similar to the method in Embodiment 2, details being omitted here.

Figure 13:
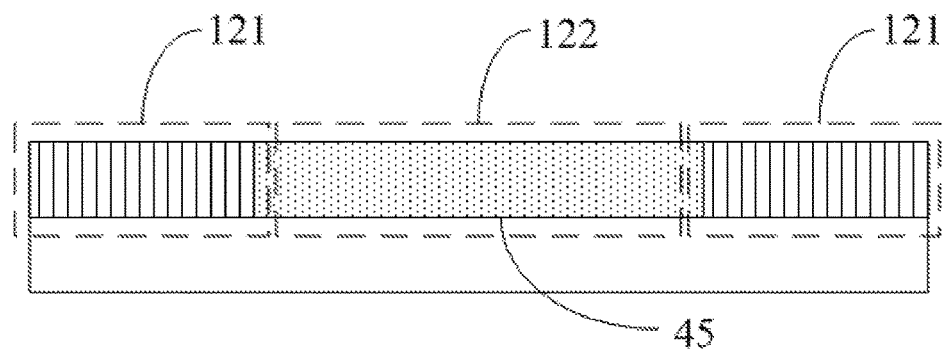
FIG. 13 is a schematic view illustrating the sectional structure of an organic thin film transistor provided by an embodiment of the invention.

As illustrated in FIG. 13, according to an embodiment of the invention, there is further provided an organic thin film transistor manufactured by using the above method of the first embodiment or the second embodiment. The organic thin film transistor includes an organic semiconductor layer 45, which includes a doped region 121 and a non-doped region 122 that corresponds to a region where an active layer of the organic thin film transistor needs to be formed.

For example, the conductivity of the doped region 121 is smaller than the conductivity of the non-doped region 122.

For example, as seen from a planar view, the non-doped region 121 is surrounded by the doped region 122, as illustrated in FIG. 5.

In addition, as can be seen with reference to FIG. 4 and FIG. 12, the organic thin film transistor according to embodiments of the invention further includes a gate electrode, a gate insulating layer, a source electrode and a drain electrode, wherein, the gate electrode is separated from organic semiconductor layer by the gate insulating layer, and the source electrode and the drain electrode are connected to the non-doped region of the organic semiconductor layer. The relative position relationship between the gate electrode, the organic semiconductor layer, the gate insulating layer, the source electrode and the drain electrode in the thin film transistor according to embodiments of the invention is not limited to the position relationship illustrated in FIG. 4 and FIG. 12, and can be arbitrarily adjusted according to actual needs.

According to some embodiments of the invention, there is further provided an array substrate, which includes the organic thin film transistor according to any embodiment of the invention. For example, a plurality of organic thin film transistors is arranged in the form of an array.

According to some embodiments of the invention, there is further provided a display device, which includes the array substrate according to any embodiment of the invention.

In summary, according to embodiments of the invention, there is provided a new method of patterning an organic semiconductor layer of an organic thin film transistor. When patterning is performed by using the method, the organic semiconductor layer in correspondence with a sheltered region corresponds to an organic semiconductor layer that is retained after etch in prior art, and the organic semiconductor layer in correspondence with an unsheltered region corresponds to an organic semiconductor layer that is removed by etch in prior art. As a result, when the organic semiconductor layer of the organic thin film transistor is patterned in embodiments of the invention, there is no need to use an etching method, and the process steps of etching can be decreased. Thus, the manufacturing process of the organic thin film transistor is simplified, and the manufacturing cost of the organic thin film transistor is reduced. Moreover, such a patterning effect that etching solvent or other industrial solvent is not used is achieved. Consequently, such a technical problem that a solvent or reaction ion affects properties of an organic thin film during etch in prior art is solved. Further, an insulating region is formed at the edge of the zone of an active layer of the organic thin film transistor manufactured in embodiments of the invention, and it is possible that the off-state current of the organic thin film transistor is effectively reduced, and the on/off ratio of the organic thin film transistor is enhanced.

The foregoing embodiments merely are exemplary embodiments of the invention, and not intended to define the scope of the invention, and the scope of the invention is determined by the appended claims.

The application claims priority of Chinese Patent Application No. 201410784404.4 filed on Dec. 16, 2014, the disclosure of which is incorporated herein by reference in its entirety as part of the present application.

The invention claimed is:

1. A manufacturing method of an organic thin film transistor, comprising:
   forming an organic semiconductor layer;
   partially sheltering the organic semiconductor layer, so that a sheltered region and an unsheltered region are formed on the organic semiconductor layer, wherein, the sheltered region corresponds to a region where an active layer of the organic thin film transistor is configured to be formed; and
   doping the organic semiconductor layer, so that the organic semiconductor layer in correspondence with the sheltered region is not doped, and the organic semiconductor layer in correspondence with the unsheltered region is doped,
   wherein, the unsheltered region of the organic semiconductor layer after being doped has a conductivity smaller than a conductivity of the non-doped region of the organic semiconductor layer.

2. The method according to claim 1, prior to the doping the organic semiconductor layer, further comprising:
   forming a gate electrode on a base substrate by a patterning process;
   forming a gate insulating layer on the gate electrode; and
   forming a source electrode and a drain electrode on the gate insulating layer by a patterning process,
   wherein, the doped organic semiconductor layer is formed on the source electrode and the drain electrode, and the source electrode and the drain electrode are connected to a non-doped region of the organic semiconductor layer.

3. The method according to claim 1, further comprising:
   forming a first insulating layer on the doped organic semiconductor layer;
   forming a gate electrode on the first insulating layer by a patterning process;
   forming a second insulating layer on the gate electrode; and
   forming a source electrode and a drain electrode on the second insulating layer by a patterning process,
   wherein, the source electrode and the drain electrode are connected to a non-doped region of the organic semiconductor layer through via holes.

4. The method according to claim 3, prior to the forming the organic semiconductor layer, further comprising:
   forming a light blocking layer on a base substrate; and
   forming a buffer layer on the light blocking layer.

5. The method according to claim 1, wherein, the forming the organic semiconductor layer comprises:
   forming the organic semiconductor layer by a solution method or vacuum evaporation method.

6. The method according to claim 2, wherein, the partially sheltering the organic semiconductor layer and the doping the organic semiconductor layer comprise:
   partially sheltering the organic semiconductor layer with a metal mask, so that the sheltered region and the unsheltered region are formed on the organic semiconductor layer, wherein, the region sheltered by the metal mask corresponds to the region where the active layer of the organic thin film transistor is configured to be formed; and
   doping the organic semiconductor layer, so that the organic semiconductor layer in correspondence with the sheltered region is not doped, and the organic semiconductor layer in correspondence with the unsheltered region is doped.

7. The method according to claim 3, wherein, the partially sheltering the organic semiconductor layer and the doping the organic semiconductor layer comprise:
   partially sheltering the organic semiconductor layer with a metal mask, so that the sheltered region and the unsheltered region are formed on the organic semiconductor layer, wherein, the region sheltered by the metal mask corresponds to the region where the active layer of the organic thin film transistor is configured to be formed; and
   doping the organic semiconductor layer, so that the organic semiconductor layer in correspondence with the sheltered region is not doped, and the organic semiconductor layer in correspondence with the unsheltered region is doped.

8. The method according to claim 2, wherein, the partially sheltering the organic semiconductor layer and the doping the organic semiconductor layer comprise:
- coating a layer of photoresist on the organic semiconductor layer, and removing a part of the photoresist by exposure and development, so that a photoresist covering region and a photoresist uncovering region are formed on the organic semiconductor layer, wherein, the photoresist covering region corresponds to the region where the active layer of the organic thin film transistor is configured to be formed; and
- doping the organic semiconductor layer, so that the organic semiconductor layer in correspondence with the photoresist covering region is not doped, and the organic semiconductor layer in correspondence with the photoresist uncovering region is doped; and
- removing the photoresist at the photoresist covering region.

9. The method according to claim 3, wherein, the partially sheltering the organic semiconductor layer and the doping the organic semiconductor layer comprise:
- coating a layer of photoresist on the organic semiconductor layer, and removing a part of the photoresist by exposure and development, so that a photoresist covering region and a photoresist uncovering region are formed on the organic semiconductor layer, wherein, the photoresist covering region corresponds to the region where the active layer of the organic thin film transistor is configured to be formed;
- doping the organic semiconductor layer, so that the organic semiconductor layer in correspondence with the photoresist covering region is not doped, and the organic semiconductor layer in correspondence with the photoresist uncovering region is doped; and
- removing the photoresist at the photoresist covering region.

10. The method according to claim 8, wherein, the photoresist is a fluorinated photoresist.

11. The method according to claim 9, wherein, the photoresist is a fluorinated photoresist.

12. The method according to claim 1, wherein, the doping the organic semiconductor layer comprises doping the organic semiconductor layer by a solution method or vacuum evaporation method.

13. The method according to claim 12, wherein, a dopant used for doping the organic semiconductor layer is an organic small molecule.

14. The method according to claim 1, wherein, the unsheltered region of the organic semiconductor layer is formed into an insulating region after being doped.

* * * * *